(12) United States Patent
Kim et al.

(10) Patent No.: US 7,847,620 B2
(45) Date of Patent: Dec. 7, 2010

(54) CHARGE PUMPING CIRCUIT WITH DECREASED CURRENT CONSUMPTION

(75) Inventors: Jong Sam Kim, Chungcheongbuk-do (KR); Jong Chern Lee, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/136,429

(22) Filed: Jun. 10, 2008

(65) Prior Publication Data

US 2009/0167417 A1     Jul. 2, 2009

(30) Foreign Application Priority Data

Jan. 2, 2008 (KR) ........................ 10-2008-0000290

(51) Int. Cl.
G05F 1/10 (2006.01)
G05F 3/02 (2006.01)

(52) U.S. Cl. .................. 327/536; 327/537; 363/59; 363/60

(58) Field of Classification Search ............... 327/148, 327/157, 536, 537; 331/57; 363/59, 60
See application file for complete search history.

(56) References Cited

U.S. PATENT DOCUMENTS 6,490,220 B1 * 12/2002 Merritt et al. ............... 365/226
2002/0033731 A1 * 3/2002 Lee et al. .................... 327/536
2002/0101277 A1 * 8/2002 Choi .......................... 327/536
2006/0220728 A1 * 10/2006 Chun ......................... 327/536
2006/0244514 A1 * 11/2006 Lee et al. .................... 327/536

FOREIGN PATENT DOCUMENTS

KR    1020070036605 A    4/2007
KR    1020070101911 A    10/2007

OTHER PUBLICATIONS

Wikipedia—Latch (electronic) http://en.wikipedia.org/wiki/Latch_(electronics).*

* cited by examiner

*Primary Examiner*—Lincoln Donovan
*Assistant Examiner*—Brandon S Cole
(74) *Attorney, Agent, or Firm*—Ladas & Parry LLP

(57) ABSTRACT

A charge pumping circuit consumes less current by reducing the number of charge pumps operating simultaneously. The charge pumping circuit includes a voltage sensor that detects a level of a high voltage and outputs a control signal based on the detection result. An oscillator provides an oscillating clock signal in response to the control signal of the voltage sensor, and the oscillator sequentially outputs the clock signal as a plurality of clock signals having shifted phases A plurality of high-voltage pumps are disposed in a plurality of regions to pump the high voltage in response to the clock signals and a different phase is designated for each region.

6 Claims, 3 Drawing Sheets

CHARGE PUMPING CIRCUIT WITH DECREASED CURRENT CONSUMPTION

CROSS-REFERENCE TO RELATED APPLICATIONS

The present application claims priority to Korean patent application number 10-2008-0000290 filed on Jan. 2, 2008, which is incorporated herein by reference in its entirety.

BACKGROUND OF THE INVENTION

The present invention relates to a charge pumping circuit, and more particularly to a charge pumping circuit in which the layout and current consumption are improved by reducing the number of simultaneously operating charge pumps in a DRAM.

Typically, during the operation of a DRAM various voltages are utilizing. The DRAM is equipped with a charge pumping circuit which detects the level of a supplied voltage and which pumps the voltage in order to maintain a predetermined voltage level.

A DRAM cell can use a high voltage Vpp or a back bias voltage Vbb upon operation of the cell, and the DRAM cell is equipped with a distinct charge pumping circuit for the purpose of supplying the high voltage Vpp or the back bias voltage Vbb.

The high voltage Vpp can be used for read and write operations of the DRAM cell. A typical circuit used for pumping the high voltage Vpp is shown in FIG. 1.

The charge pumping circuit of FIG. 1 includes a high voltage sensor VPP SENSOR 10, a high voltage oscillator 12, and high-voltage pumps VPP Pump 14 which receive pulse signals outputted from the high voltage oscillator 12.

Herein, the high voltage sensor 10 detects the level of the high voltage Vpp and generates a control signal if the level of the high voltage Vpp decreases to a predetermined level. The control signal generated by the voltage sensor enables pumping to restore the high voltage Vpp to the desired level. The control signal output by the high voltage sensor 10 has either a high or low level.

The high voltage oscillator 12 receives the control signal from the high voltage sensor 10 and generates a clock signal OSC using an internal oscillating operation when the control signal is in an enabled state. The clock signal OSC outputted from the high voltage oscillator 12 has a predetermined period and a predetermined pulse width. Also, the high-voltage oscillator 12 is configured with a ring oscillator, in which a plurality of inverters forms a closed-loop chain.

The high-voltage pumps 14 are disposed in a plurality of regions (region 1, region 2, region 3, in FIG. 1) where the high voltage must be supplied. The number of the high-voltage pumps 14 for each region can be determined according to the drive capability requirements of the corresponding region. As shown in FIG. 1, three high-voltage pumps 14 are disposed in region 1, six high-voltage pumps 14 are disposed in region 2, and four high-voltage pumps 14 are disposed in region 3.

Each high-voltage pump 14 in each region receives the clock signal OSC having the same period and pulse width from the high voltage oscillator 12, and each high voltage pump 14 pumps the high voltage Vpp in synchronization with the clock signal OSC to supply the high voltage Vpp to an element (e.g., sense amplifier) of the corresponding region.

As a result, in the conventional charge pumping circuit shown in FIG. 1, each of the high-voltage pumps 14 are operated simultaneously in response to the single pulse signal OSC in order to pump the high voltage Vpp.

If large numbers of high-voltage pumps operate at the same time, large amount of current is consumed, and thus the peak current is extremely high. When a charge pump of high voltage Vpp is utilized (thereby resulting in a large amount of consumed current), current from the external supply voltage VDD is also consumed, and therefore in a typical circuit for pumping the high voltage Vpp the operational characteristics of a DRAM are deteriorated.

Further, the large number of high-voltage pumps configured in the typical circuit of FIG. 1 has a disadvantage in terms of the layout of the circuit.

SUMMARY OF THE INVENTION

There is provided a charge pumping circuit which improves peak current and layout by reducing the number of simultaneously operating charge pumps.

A charge pumping circuit according to the present invention comprises a voltage sensor detecting a high voltage and outputting a control signal corresponding to the detection result; an oscillator providing an oscillating clock signal in response to the control signal of the voltage sensor and sequentially outputting the clock signal as a plurality of clock signals having shifted phases; and a plurality of high-voltage pumps disposed in a plurality of regions to pump the high voltage, and a clock signal having a different phase is input to each region.

Herein, the plurality of clock signals are shifted by one period.

Further, the oscillator is controlled by a bank active control signal.

Further, the high-voltage pump is disposed in a pair unit, and any one of the high-voltage pumps included in the pair receives the clock signal via an inverter.

Alternatively, the high-voltage pump may be disposed in a pair unit where any one of the high-voltage pumps included in the pair receives the clock signal via a latch.

Herein, the latch latches the clock signal by semi-period.

According to the present invention, it is possible to improve the peak current since the number of simultaneously operating charge pumps is reduced. Also, the layout of the present invention is improved, since a sufficient high-voltage pumping current can be provided with a smaller number of pumps.

DESCRIPTION OF SPECIFIC EMBODIMENTS

Hereinafter, preferred embodiments of the present invention will be described in detail with reference to the accompanying drawings.

The present invention is constructed in such a way as to allow high-voltage pumps to be sequentially pumped in each region by providing clock signals having sequentially shifted phases to high-voltage pumps disposed in various regions for each bank in a DRAM.

Figure 2:
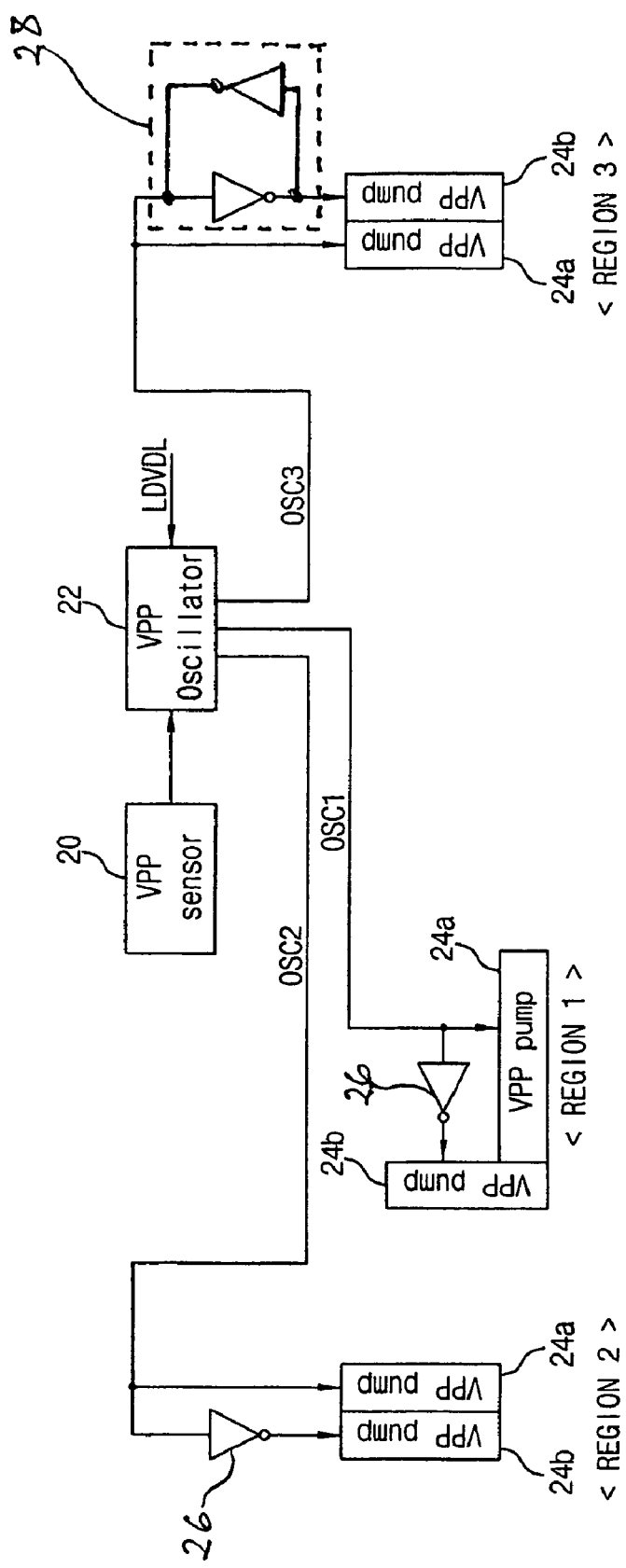
FIG. 2 is a block diagram showing a charge pumping circuit according to an embodiment of the present invention.

Referring to FIG. 2, the charge pumping circuit shown in FIG. 2 is constructed with respect to high voltage as an example; however, the charge pumping circuit according to the present invention can be also used for other voltages such as a back-bias voltage.

The charge pumping circuit according to an embodiment of the present invention includes a high voltage sensor 20, a high voltage oscillator 22, and a plurality of high-voltage pumps 24a, 24b.

The high voltage sensor 20 detects the level of a high voltage Vpp and generates a control signal if the level of the high voltage Vpp decreases to a predetermined level. The control signal generated by the high voltage sensor 20 enables pumping. The high voltage sensor 20 can, for example, be constructed to output the control signal at a high level when the control signal is in an enabled state if the level of the high voltage Vpp decreases to the predetermined level.

The high voltage oscillator 22 outputs clock signals OSC1, OSC2, and OSC3, each of which has a different phase, when an enabled control signal is applied from the high voltage sensor 10.

Figure 3:
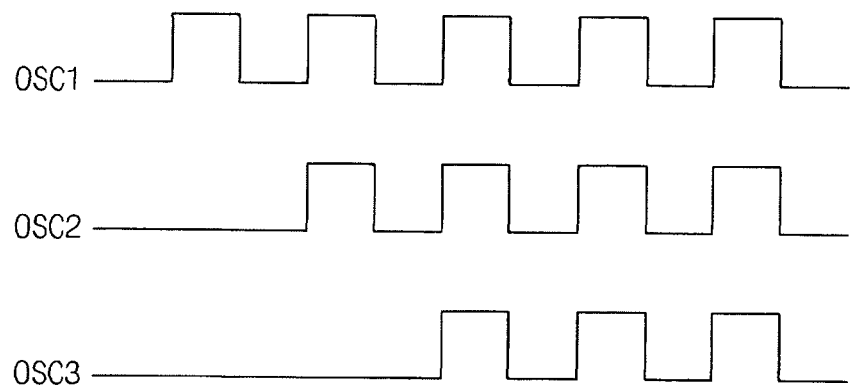
FIG. 3 is a waveform diagram of clock signals provided according to the present invention.

The clock signals OSC1, OSC2, and OSC3 can be sequentially shifted by a single period as is shown in FIG. 3. The number of phase-shifted periods may be adjusted as necessary. Preferably, the clock signals OSC1, OSC2, and OSC3 are generated to have the same period and pulse width.

The high voltage oscillator 22 can be constructed as a well-known ring-oscillator. Also, the high voltage oscillator 22 can be constructed such that the clock signal OSC1 is generated and then the clock signals OSC2, OSC3, are sequentially outputted by shifting the phase of the clock signal by one period using a phase shifter (not shown). Since the phase shifter can be implemented by a person skilled in the art, a specific example has been omitted.

Further, the high voltage ring oscillator 22 can be controlled to enable an oscillating operation in response to a bank active control signal LDVDL. The bank active control signal LDVDL is supplied from outside of the charge pumping circuit to control the oscillating operation in accordance with the modes of a bank unit. The bank active control signal LDVDL may also be supplied using any means that reduces current consumption by preventing unnecessary oscillation for a portion selected from a plurality of banks.

Meanwhile, the high-voltage pumps 24a, 24b pump the high voltage Vpp to provide the high voltage to an element (e.g., a sense amplifier) of the corresponding region in response to the clock signals OSC1, OSC2, OSC3.

The high-voltage pumps 24a, 24b are constructed as a pair unit, and at least one pair can be disposed in each region. The number of generated clock signals corresponds to the number of pair-units, a region-unit, or a unit grouping a plurality of regions.

The pair of high-voltage pumps 24a, 24b of a region can be constructed such that a corresponding one of the clock signals OSC1, OSC2, OSC3 may be inputted to any one of the high voltage pumps 24a, 24b of the pair via an inverter 26 or a latch 28. Therefore, since the high-voltage pumps operate with a phase difference between respective regions, it possible to reduce the number of the high-voltage pumps operating at the same time.

In the embodiment of the present invention shown in FIG. 2, a total of 6 high-voltage pumps are disposed, since a pair of high-voltage pumps is disposed in each region (region 1, region 2, and region 3).

The high-voltage pumps disposed as such are sequentially operated by the clock signals having the timings shown in FIG. 3.

Specifically, only the high-voltage pump of region 1 is operated when the operation of the clock signal OSC1 begins; only the high-voltage pumps of region 1 and region 2 operate when the operation of the clock signal OSC2 begins, and the high-voltage pumps of region 1, region 2, and region 3 operate when the operation of the clock signal OSC3 begins.

Therefore, the number of the high-voltage pumps which initially operate is not large, and the peak current is thereby lowered.

Figure 1:
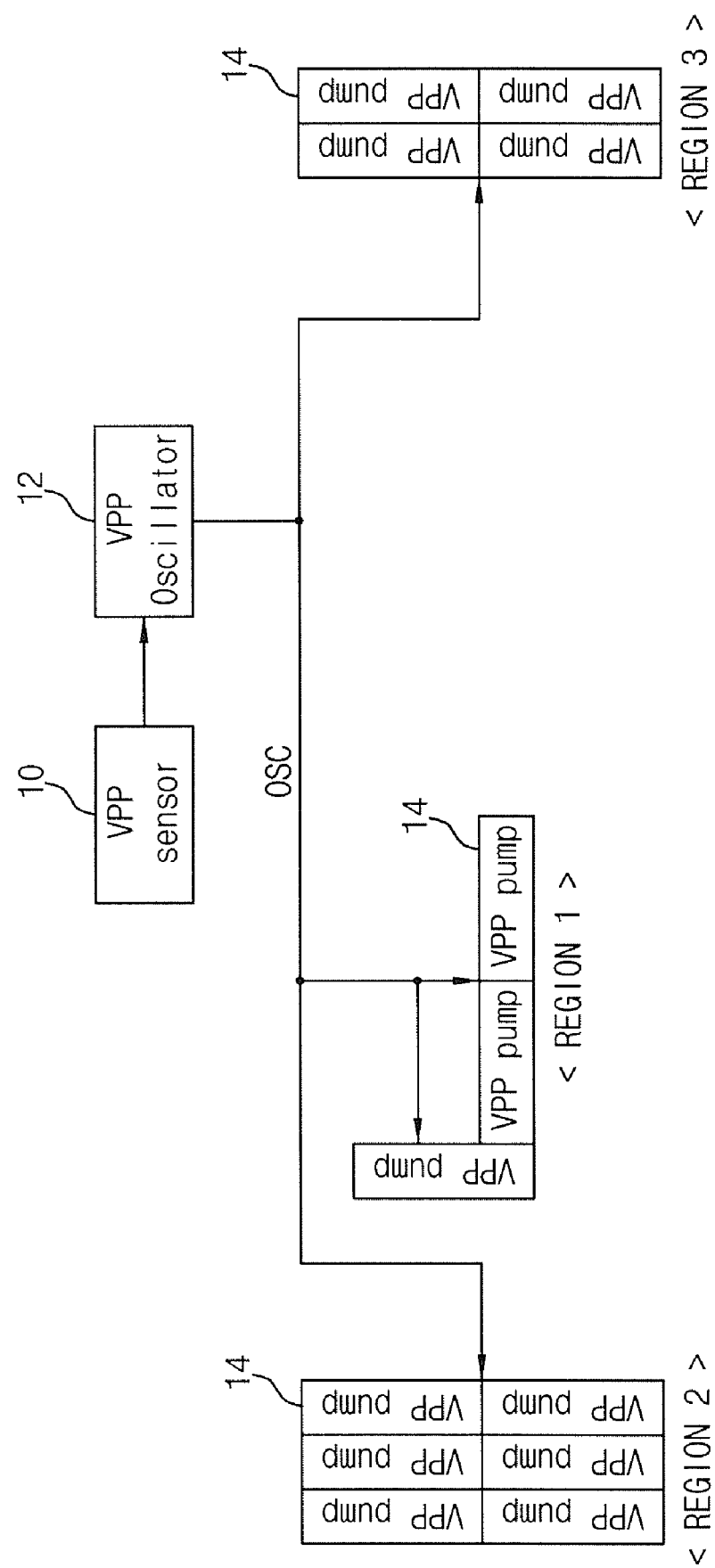
FIG. 1 is a block diagram showing a conventional charge pumping circuit.
Figure 4:
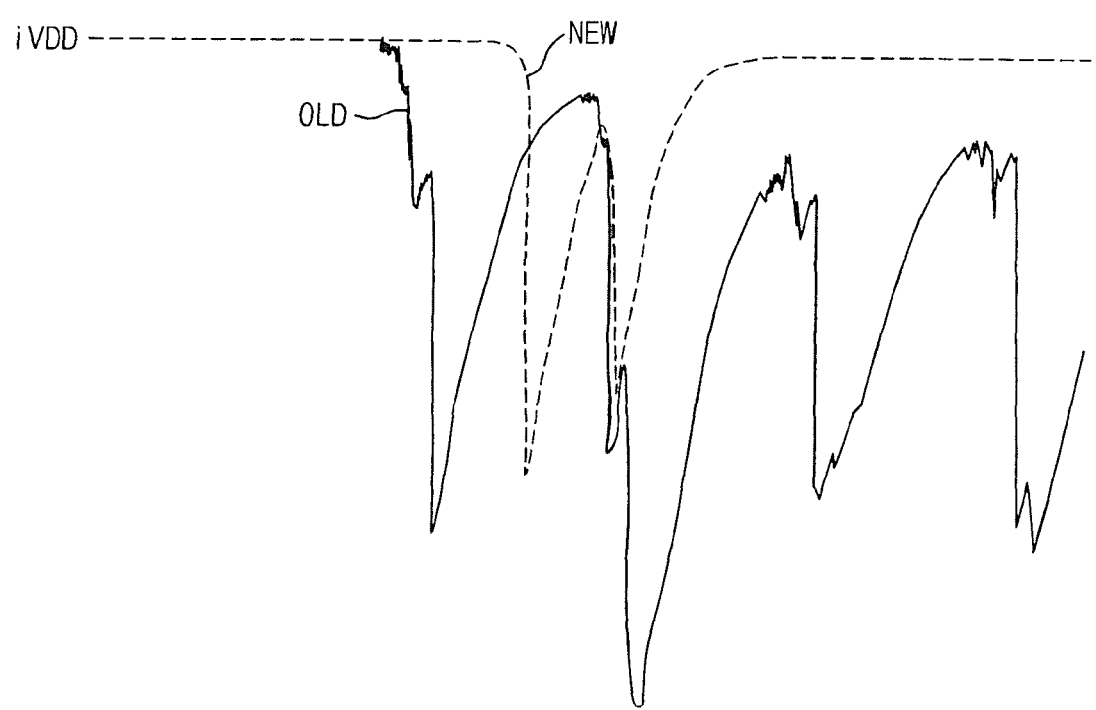
FIG. 4 is a waveform diagram shown for illustrating the peak current of the charge pumping circuit according to an embodiment of the present invention.

In the present invention, the peak current iVDD is improved as is indicated by the waveform designated NEW in FIG. 4. As can be observed from FIG. 4, the present invention provides a considerable improvement when compared to the signal designated OLD which has a peak current iVDD corresponding to the conventional circuit of FIG. 1.

When large numbers of the high-voltage pumps are used simultaneously, current from the external power supply voltage VDD is consumed and excessive peak currents are produced as indicated by the signal designated OLD in FIG. 4.

As described above, the present invention has an advantage in that peak current is improved. The present invention provides an additional benefit, in that the layout of the present invention includes a reduced number of high-voltage pumps.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A charge pumping circuit, comprising:
a voltage sensor detecting a level of a voltage and outputting a control signal corresponding to the detection result;
an oscillator providing an oscillating clock signal in response to the control signal and sequentially outputting the clock signal as a plurality of clock signals, wherein the phase of each clock signal is shifted with respect to each other; and
a plurality of voltage pumps disposed in a plurality of regions to pump the voltage, wherein each region has corresponding voltage pumps for pumping the voltage, and for each region the pumps of the region pump the voltage and provide the pumped voltage as a supply voltage for operation of the region independently of the other regions, so as to have a plurality of the separately provided supply voltages for the plurality of regions,
wherein the corresponding voltage pumps of each region operate in response to a corresponding one of the clock signals, such that each region is designated a different phase and operation beginning points, each being the point at which pumping of the voltage of the corresponding region begins, of the regions do not begin simultaneously, and
wherein a pair of the voltage pumps are disposed in each region, and only one of the voltage pumps included in the pair receives the corresponding clock signal via a latch while the other of the pair receives the corresponding clock signal as a non-inverted clock signal.

2. The charge pumping circuit as set forth in claim 1, wherein the phase of each of the sequentially output clock signals is shifted by one period.

3. The charge pumping circuit as set forth in claim 1, wherein the oscillator operates in response to a bank active control signal.

4. The charge pumping circuit as set forth in claim 1, wherein the voltage detected by the voltage sensor is a high voltage, and the voltage pumps are high-voltage pumps.

5. A charge pumping circuit, comprising:

a voltage sensor detecting a level of a voltage and outputting a control signal corresponding to the detection result;

an oscillator providing an oscillating clock signal in response to the control signal and sequentially outputting the clock signal as a plurality of clock signals, wherein the phase of each clock signal is shifted with respect to each other; and a plurality of voltage pumps disposed in a plurality of regions to pump the voltage, wherein each region is supplied the voltage and has corresponding voltage pumps for pumping the voltage, and the corresponding voltage pumps of each region operate in response to a corresponding one of the clock signals, such that each region is designated a different phase and operation beginning points, each being the point at which pumping of the voltage of the corresponding region begins, of the regions do not begin simultaneously, and wherein a pair of the voltage pumps are disposed in each region, and only one of the voltage pumps included in the pair receives the corresponding clock signal via a latch while the other of the pair receives the corresponding clock signal as a non-inverted clock signal.

6. The charge pumping circuit as set forth in claim 5, wherein the latch latches the clock signal by semi-period.

* * * * *